(12) United States Patent
Nakamura

(10) Patent No.: US 6,396,093 B1
(45) Date of Patent: May 28, 2002

(54) FERROELECTRIC MEMORY WITH REDUCED CAPACITANCE OF FERROELECTRIC GATE LAYER

(75) Inventor: Takashi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/554,060

(22) PCT Filed: Oct. 30, 1998

(86) PCT No.: PCT/JP98/04954

§ 371 (c)(1),
(2), (4) Date: May 9, 2000

(87) PCT Pub. No.: WO99/26284

PCT Pub. Date: May 27, 1999

(30) Foreign Application Priority Data

Nov. 14, 1997  (JP) ............................................. 9-313358

(51) Int. Cl.[7] .............................................. H01L 29/76
(52) U.S. Cl. ........................... 257/295; 257/288; 438/3; 438/197
(58) Field of Search ................................. 257/288, 295; 438/3, 197

(56) References Cited

U.S. PATENT DOCUMENTS 5,350,705 A * 9/1994 Brassington et al. ....... 257/295

FOREIGN PATENT DOCUMENTS

| JP | 07297302 A | * 11/1995 | ....... H01L/21/8247 |
| JP | 09121023 A | * 5/1997 | ........... H01L/27/04 |

* cited by examiner

Primary Examiner—Nathan Flynn
Assistant Examiner—Scott R. Wilson
(74) Attorney, Agent, or Firm—Hogan & Hartson, L.L.P.

(57) ABSTRACT

On part of a semiconductor layer 1 between a drain region 2 and a source region 3 are formed in succession; a gate oxide film 4, a floating gate electrode 5, a ferroelectric layer 6, and a control gate electrode 7. A silicon oxide film 9 of a dielectric constant lower than that of the ferroelectric layer 6 is disposed between the floating gate electrode 5 and the ferroelectric layer 6 in the area excluding approximate central area of the active region. The silicon oxide film 9 is sufficiently small in dielectric constant than the ferroelectric layer. Since the capacitance of the portion where the silicon oxide film 9 is present can be neglected, substantial capacitance of the ferroelectric layer can be reduced, so that an increased partial voltage can be applied.

12 Claims, 10 Drawing Sheets

FERROELECTRIC MEMORY WITH REDUCED CAPACITANCE OF FERROELECTRIC GATE LAYER

TECHNICAL FIELD

This invention relates to a non-volatile semiconductor device having a ferroelectric layer, more specifically to improvement in partial voltage applied to the ferroelectric layer.

BACKGROUND ART

FIG. 9 shows a cross section of an essential part of a conventional ferroelectric memory 50. The ferroelectric memory 50 comprises a semiconductor substrate 51 on which are formed in succession; a gate oxide film 54, a floating gate electrode 55, a ferroelectric layer 56, and a control gate electrode 57.

In the ferroelectric memory 50, not much part of the voltage applied to the control gate 57 for switching polarized state is applied to the ferroelectric layer 56. This is because the dielectric constant $\in$ of the ferroelectric is much greater (several hundred times) than that of $SiO_2$ or the like, and the capacitance of the ferroelectric layer 56 is much greater than that of the gate oxide film 54. The partial voltages on capacitors connected in series are inversely proportional to their capacities.

To solve the problem, it is proposed for example in the Transaction of 14th Ferroelectric Application Convention, "Development of Low Dielectric Constant Ferroelectric Material for MFMISFET" (14th Ferroelectric Application Convention, issued September 1997, pages 31–32) to reduce the capacitance of the ferroelectric layer by developing a ferroelectric material of a smaller dielectric constant, or to increase the capacitance of the insulation film by reducing the thickness of the gate oxide film. However, there is limitation of development of materials. Reducing thickness of the gate oxide film results in a lower dielectric resistance.

A ferroelectric memory transistor 101 shown in FIG. 10 which is intended to solve the above problems is disclosed in JP-A-9-252099. FIG. 10B shows a section XB—XB in FIG. 10A.

The ferroelectric memory transistor 101 comprises, as shown in FIGS. 10A and 10B, a floating gate electrode 124 in the active 15 region 168, on which is formed an insulation film 130, and on which is a ferroelectric layer 134. A contact hole 132 is formed in the inactive region 130. The floating gate electrode 124 and the ferroelectric layer 134 are in mutual contact in the inactive region 130.

In the ferroelectric memory transistor 101, the partial voltage between the floating gate electrode 124 and the substrate region 112 can be reduced and the partial voltage between the floating gate electrode 124 and a control gate 136 can be increased by only changing the area of the contact hole 132. The capacitor constituted between the control gate 136 and a P well 112 in the ferroelectric memory transistor 101 has a capacitance equivalent to the resultant capacitance shown in FIG. 10C in which capacitors CF and CG are connected in series. The capacitance CF is a resultant capacitance resulting from the parallel connection of the capacitors C1 and C2. The capacitance C1 is a capacitance defined with the insulation film 130 and the ferroelectric layer 134 on the active region 168, while the capacitance C2 is a capacitance defined with the ferroelectric layer 134 on the element separation region 114. Since the ferroelectric layer is much higher in dielectric constant than the insulation film, the capacitance CF may be approximated with the capacitance C2. Therefore, the capacitance CF may be reduced by reducing the capacitance C2. This makes it possible to reduce the partial voltage applied to the capacitor CG and increase the partial voltage applied to the capacitor CF.

However, even if the partial voltage between the floating gate electrode 124 and the substrate region 112 is reduced and the partial voltage between the floating gate electrode 124 and the control gate electrode 136 is increased, then the partial voltage applied to the ferroelectric layer 134 on the active region 168 cannot be increased much. This is because the insulation film 130 is much smaller in dielectric constant than the ferroelectric layer 134 and higher partial voltage is applied to the insulation film 130 than to the ferroelectric layer 134 on the active region 168.

Also it is disclosed in JP-A-9-205181, to reduce opposing area by reducing the upper electrode. However, since this method uses the ion milling process, the surface of the ferroelectric layer is damaged.

The above-described problem of reduced partial voltage associated with the ferroelectric memory constituted with the gate insulation film, floating gate electrode, ferroelectric layer, and control gate electrode also occurs in the ferroelectric memory in which there is no floating gate electrode between the gate insulation film and the ferroelectric layer.

DISCLOSURE OF THE INVENTION

The object of the invention is to provide a ferroelectric semiconductor memory device capable of solving the above-described problems, namely capable of applying higher partial voltage by reducing the substantial area of the ferroelectric layer.

The ferroelectric semiconductor memory device of the invention comprises:

A)
- a1) a semiconductor substrate having a substrate region of a first conductive type;
- a2) a pair of impurity regions of a second conductive type formed on the surface of the first conductive region;
- a3) a first insulation film formed on the substrate region between the pair of impurity regions;
- a4) a ferroelectric layer formed on the first insulation film;
- a5) an upper electrode formed on the ferroelectric layer; and B) a substantial capacitance reducing insulation film formed between the first insulation film and the upper electrode and only on part of the substrate region between the pair of impurity regions to reduce substantial capacitance of the ferroelectric layer.

The ferroelectric semiconductor memory device of the invention is characterized by comprising:

A)
- a1) a semiconductor substrate having a substrate region of a first conductive type;
- a2) a pair of impurity regions of a second conductive type formed on the surface of the first conductive region;
- a3) a first insulation film formed on the substrate region between the pair of impurity regions;
- a4) a ferroelectric layer formed on the first insulation film;
- a5) an upper electrode formed on the ferroelectric layer; and B) a substantial capacitance reducing insulation film formed between the first insulation film and the upper electrode to reduce substantial capacitance of the ferroelectric layer, and having, on the substrate region between the pair of impurity regions, a portion in which only the ferroelectric layer is present and a portion in which the capacitance reducing insulation film and the ferroelectric layer are present in superimposed state.

The method of manufacturing the ferroelectric memory device of the invention is characterized by comprising the steps of:

A)
- a1) providing a semiconductor substrate having a substrate region of a first conductive type;
- a2) forming a first insulation film in part of the substrate region and on the substrate region;
- a3) forming a ferroelectric layer and an upper electrode on the first insulation film;
- a4) forming an impurity region of a second conductive type in the substrate region by implanting the second conductive type of impurity using the upper electrode as a mask; and B) forming a capacitance reducing insulation film between the first insulation film and the upper electrode to reduce substantial capacitance of the ferroelectric layer, and having, on the substrate region and in the lower region of the upper electrode, a portion in which only the ferroelectric layer is present and a portion in which the capacitance reducing insulation film and the ferroelectric layer are superimposed.

The semiconductor memory using a ferroelectric layer of the invention is the one having a ferroelectric memory FET in which a control gate electrode is provided on a semiconductor layer through at least a first insulation film and a ferroelectric layer, with a second insulation film being inserted in part of the upper or lower side of the ferroelectric layer corresponding to part of the area of the ferroelectric layer.

Those features and other objects, applications, effects, etc. of this invention will be apparent in reference to the embodiments and appended drawings.

BEST MODE FOR CARRYING OUT THE INVENTION

The inventors have found a method of substantially reducing the capacitor area constituted with a ferroelectric layer without etching the ferroelectric layer if a second insulation film of a small dielectric constant is interposed on the top or under side of the ferroelectric layer to be etched. If it is possible to make the capacitor area constituted with the ferroelectric layer being smaller than the capacitor area constituted with a gate oxide film, then the partial voltage applied to the ferroelectric layer may be increased. In order to reduce the capacitor area constituted with the ferroelectric layer, it is conceivable to etch the ferroelectric layer on the floating gate electrode. However, when the ferroelectric layer is etched on the floating gate electrode, the floating gate electrode is exposed and comes into contact with the control gate electrode. This requires another insulation film to be provided. Moreover, the ferroelectric layer is very difficult to etch.

A ferroelectric memory 1 as a ferroelectric semiconductor device according to the invention will be hereinafter described in reference to the appended drawings.

Figure 1A:
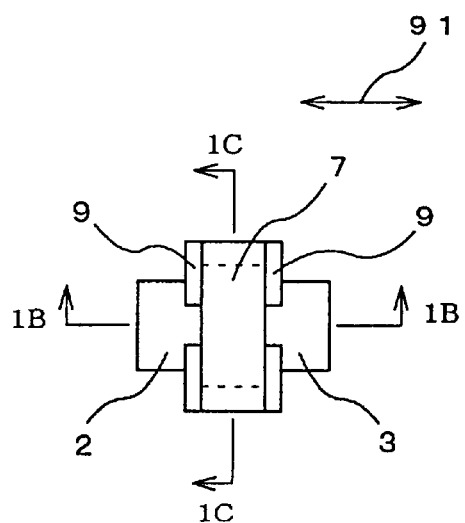
FIG. 1 is an explanatory drawing of the structure of a ferroelectric FET portion of a semiconductor memory as an embodiment of the invention.
Figure 1B:
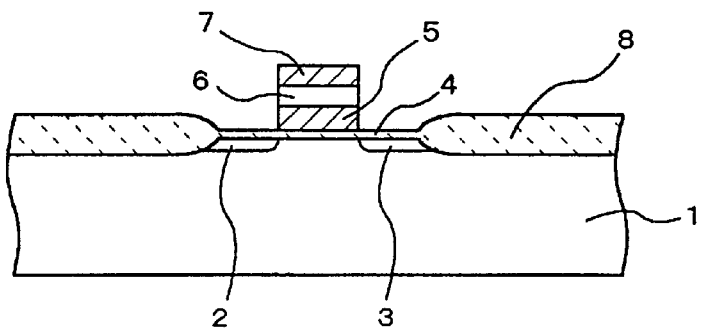
Figure 1C:
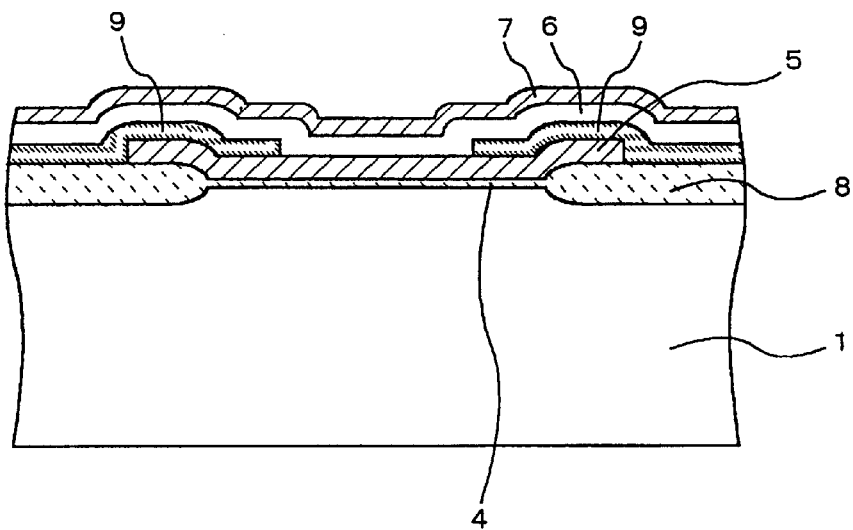

FIG. 1A is a plan view of the ferroelectric memory 1. FIGS. 1B and 1C show cross sections, along the lines 1B—1B and 1C—1C in FIG. 1A, respectively.

In the ferroelectric memory 1 shown in FIG. 1B, an n-type drain region 2 and a source region 3 are formed in a p-type semiconductor layer or well 1a. A gate oxide film 4 as a first insulation film is formed on the semiconductor layer 1 between the drain region 2 and the source region 3. A gate electrode 5 of a floating type, a ferroelectric layer 6, and a control gate electrode 7 as an upper electrode are successively formed on the gate oxide film 4. As shown in FIG. 1C, a silicon oxide film 9, as a capacitance reducing insulation film of a dielectric constant smaller than that of the ferroelectric layer, is provided between the floating gate 5 and the ferroelectric layer 6, excluding the approximately central portion of the active region.

The silicon oxide film 9 is provided as shown in FIGS. 1A and 1C on the floating gate electrode 5 so as to cover both end areas, in the direction at right angles to the direction in which the drain region 2 and the source region 3 are provided, of the floating gate electrode 5. The silicon oxide film 9 is formed in a thickness of about, 100 to 3000 angstroms by the CVD process or the like.

The silicon oxide film 9 as described above reduces the substantial area of the capacitor constituted with the ferroelectric layer 6. The thickness of the silicon oxide film 9 is preferably about, 100 to 3000 angstroms. When the thickness is too small, as will, be described later, the effect of reducing the capacitance becomes weak due to the ratio of dielectric constants. When the thickness is too great, the film forming and pattern making take much time. The thickness of the silicon oxide film 9 is more preferably about 100 to 500 angstroms. The silicon oxide film 9 is preferably formed on the floating gate electrode 5 excluding the portion serving as an active region (channel region) surrounded with the drain region 2 and the source region 3.

Now, the function of the capacitance reducing insulation film (second insulation film) will be described. The capacitance reducing insulation film has a dielectric constant sufficiently smaller than that of the ferroelectric layer. Therefore, when considering the resultant capacitance, the portion of the capacitance reducing insulation film may be substantially neglected. As a result, the dielectric capacitor area substantially decreases.

Figure 2:
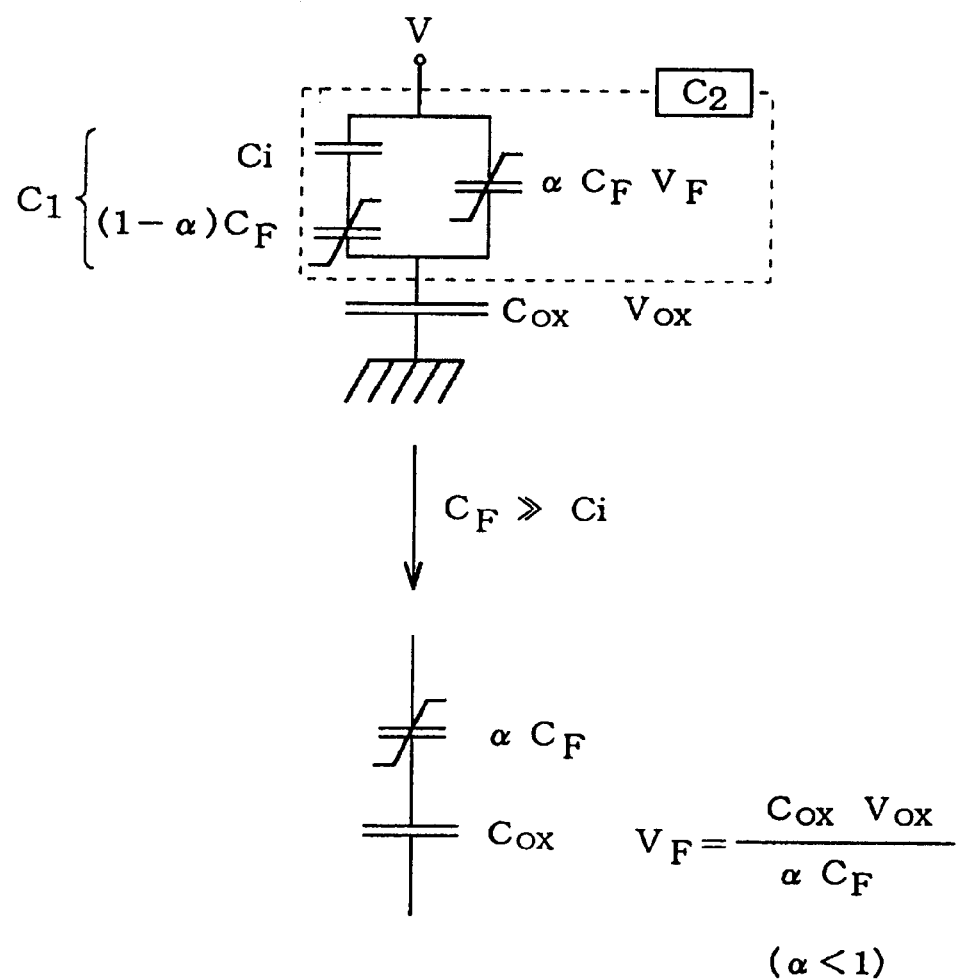
FIG. 2 is an explanatory drawing of an equivalent circuit of the capacitor portion in FIG. 1.

As shown in FIG. 2, the capacitance C2 between the control gate electrode and the floating gate electrode in the ferroelectric memory FET is expressed with the following equation (1):

$$C2 = C1 + \alpha CF \quad (1)$$

where α: ratio of the area not provided with the capacitance reducing insulation film to the ferroelectric layer area surrounded with both electrodes, CF: the capacitance of the ferroelectric layer, C1: the resultant capacitance produced with the capacitance of the capacitance reducing insulation film in the part where the capacitance reducing insulation film is provided and with the capacitance of the ferroelectric layer.

The resultant capacitance C1 is expressed with the following equation:

$$1/C1 = 1/Ci + 1/(1-\alpha)CF \quad (2)$$

where Ci: the capacitance of the capacitance reducing insulation film.

As already explained, the capacitance reducing insulation film has a dielectric constant sufficiently smaller than that of the ferroelectric layer (CF) Ci). Therefore, from the equation (2), $$C1 \approx Ci \quad (3)$$

Hence, from the equations (1) and (3), $$C2 = Ci + \alpha CF \quad (4)$$

Here, since CF>>Ci, $$C2 = \alpha CF \quad (5)$$

Therefore, the capacitance in the ferroelectric memory FET is as shown in FIG. 2 nearly equivalent to the resultant capacitance produced with the series connection of α CF and the capacitance $C_{ox}$ of the gate insulation film. Therefore, the partial voltage VF applied to the ferroelectric layer is approximated as, $$VF = C_{ox} \cdot VOX/\alpha CF (\alpha < 1)$$

Therefore, the partial voltage VF is increased by the decrease in the value of α.

That is to say, if CF>>Ci, the portion where the capacitance reducing insulation film is present may be neglected, and it may be regarded as a stacked capacitor in which the area of the ferroelectric layer is reduced (by α times). As a result, as shown in FIG. 1C, the area of the ferroelectric capacitor is smaller than the capacitor area of the gate oxide film ($SiO_2$).

The material of the capacitance reducing insulation film may be any material as long as it can make the capacitance Ci sufficiently smaller than the capacitance CF as described above. For example, using PZT ($Pb(Zr, Ti)O_3$) as the ferroelectric, having a dielectric constant of ∈=800 and a film thickness of 2000 angstrom and $SiO_2$ as the capacitance reducing insulation film, having a dielectric constant of ∈=3.9 and a film thickness of 3000 angstrom, and if α=⅓:

$CF = 800 \cdot \in 0 \cdot S/2 \times 10^{-7}$, $Ci = 3.9 \cdot \in 0 \cdot S/3 \times 10^{-7}$, and $CF/Ci = 923.08$, and thus it may be assumed that $CF >> Ci$, Here, ∈ 0 denotes the dielectric constant of vacuum, and S denotes area.

As a result, even if the same voltage is applied to the control gate electrode, a voltage three times (1/α) higher than in conventional arrangement can be applied to the ferroelectric layer according to the equation (5).

Incidentally, the silicon oxide film 9 may be provided either on top or under side of the ferroelectric layer as long as it is provided between the floating gate electrode 5 and the control gate electrode 7.

Likewise in the MFIS structure having no floating gate electrode, the capacitance reducing insulation film may be provided either on top or under side of the ferroelectric layer as long as it is provided under the control gate electrode 7.

In this embodiment, while the silicon oxide film 9 is formed in other than approximate central part of the active region, there is no limitation for the location; an arrangement suffices that a region where no capacitance reducing film exists, namely a region where the capacitance reducing film does not overlap with the ferroelectric layer, is present between the floating gate electrode and the control gate electrode in the active region.

Incidentally, while the width of the silicon oxide film 9 in the direction of arrow 91 in FIG. 1A is formed to be greater than that of the upper electrode, it may be formed with the same width. This allows to etch in the width direction collectively at a time using a photo resist after laminating a conductive layer for the upper electrode. The manufacturing process in this case will be described in reference to FIGS. 3 to 5.

Incidentally, the hatched areas in FIGS. 3A, 3B, 5A and 5B do not mean cross sections but visual discrimination from other parts. This also applies to FIG. 6 which will be described later.

Figure 3A:
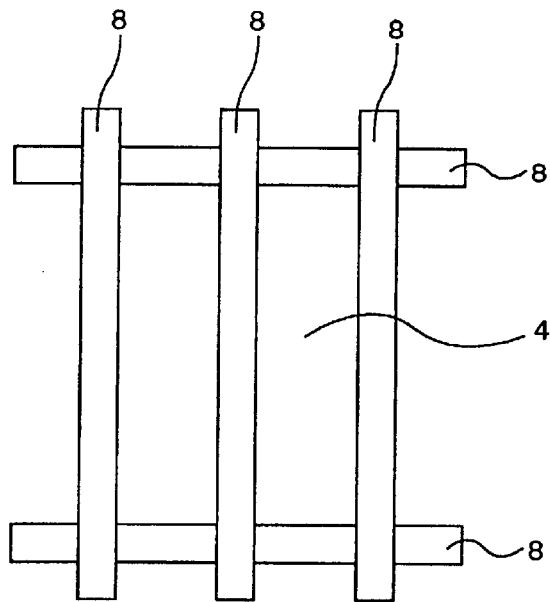
FIG. 3 is a plan view showing a manufacturing process.
Figure 3B:
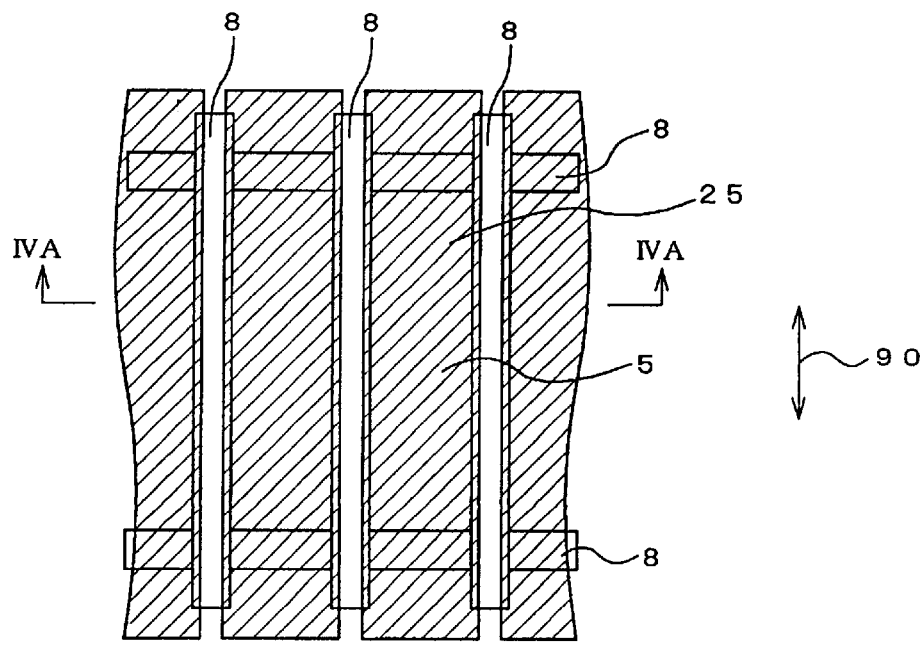
Figure 4A:
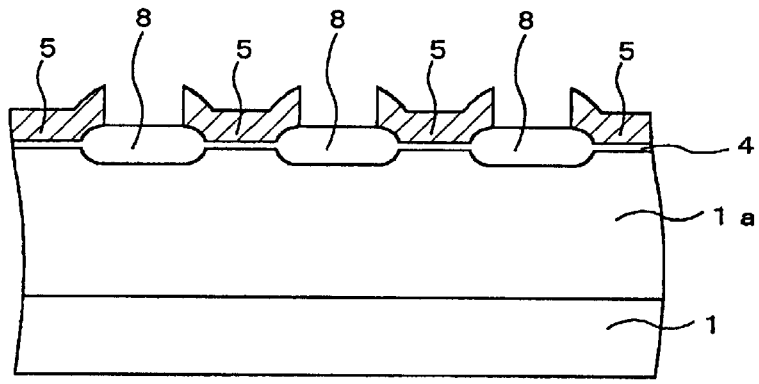
FIGS. 4A, 4B and 4C are cross-sectional views of essential parts in FIGS. 3B, 5A and 5B.
Figure 4B:
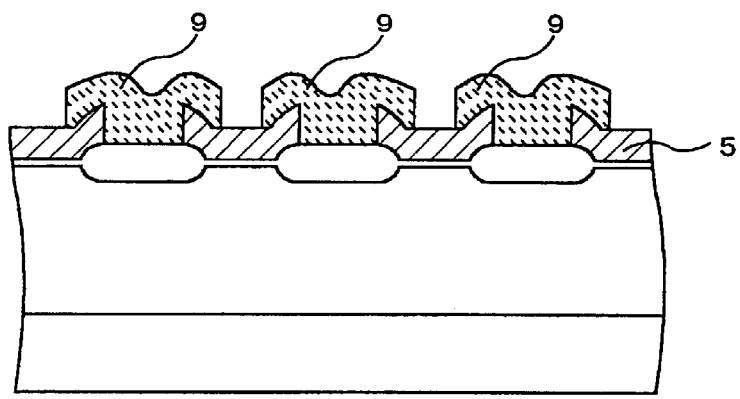
Figure 5A:
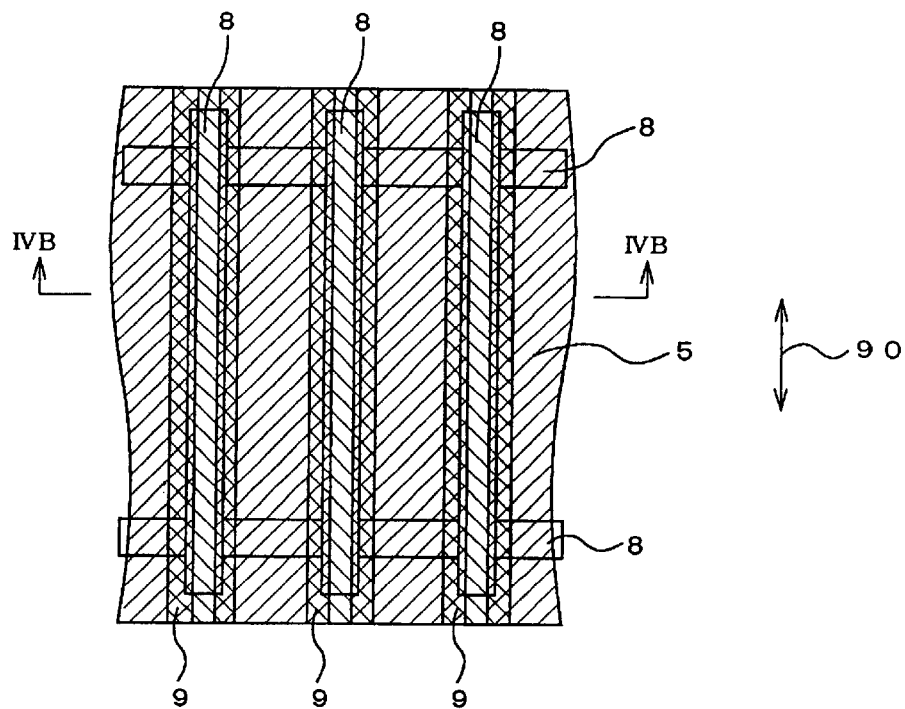
FIGS. 5A and 5B are plan views showing a manufacturing process.

As shown in FIG. 3A, LOCOS oxide films 8 are formed in a p-type well 1a of the semiconductor substrate 1. Then the p-type well 1a is divided into elements in lateral and vertical row directions by the LOCOS oxide films 8 thus formed. A 100 angstrom thick gate oxide film 4 is formed. Platinum is deposited over the entire surface and, using a mask of photo resist, an electrode layer 25 for the floating gate is formed as shown in FIG. 3B. The material for the electrode layer 25 may be selected in consideration of lattice compatibility with the ferroelectric layer formed on the layer 25 and of the crystallization process when the ferroelectric layer 6 is formed. FIG. 4A shows a cross section taken along the line IVA—IVA in FIG. 3B A 200 angstrom thick silicon oxide film is deposited over the entire surface using the CVD process, and as shown in FIG. 5A, a silicon oxide film (insulation layer) 9 is formed to cover the electrode layer 25 for the floating gate electrode on the active region except the approximate central part of the electrode layer 25 using a mask of photo resist. FIG. 4B shows a cross section taken along the line IVB—IVB in FIG. 5A. Incidentally, in place of the silicon oxide film 9, an insulation film of a small dielectric constant such as silicon nitride film and $TiO_2$ may be used.

Next, a ferroelectric layer is formed over the entire surface. The film is formed with a material of perovskite structure such as titanium oxide zirconium oxide lead (PZT), titanium oxide zirconium oxide lanthanum lead (PLZT), tantalum oxide bismuth strontium (SBT-based) by sputtering or sol-gel method, and then is subject to heat treatment. Over that entire surface is deposited a platinum layer for forming a control gate electrode by the sputtering.

Figure 4C:
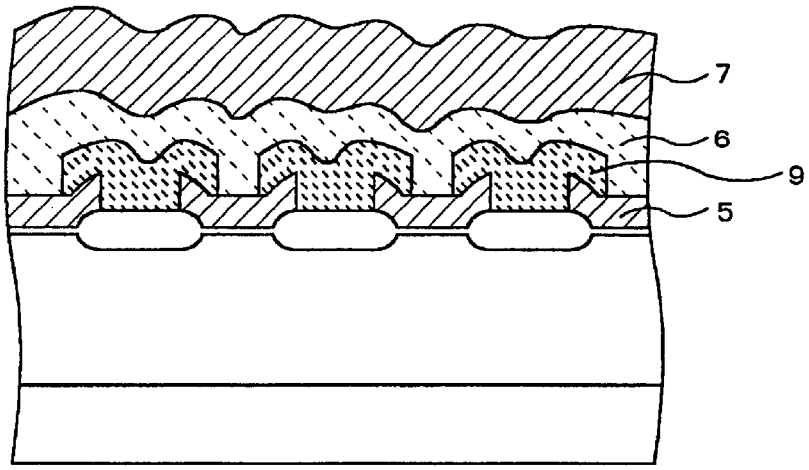
Figure 5B:
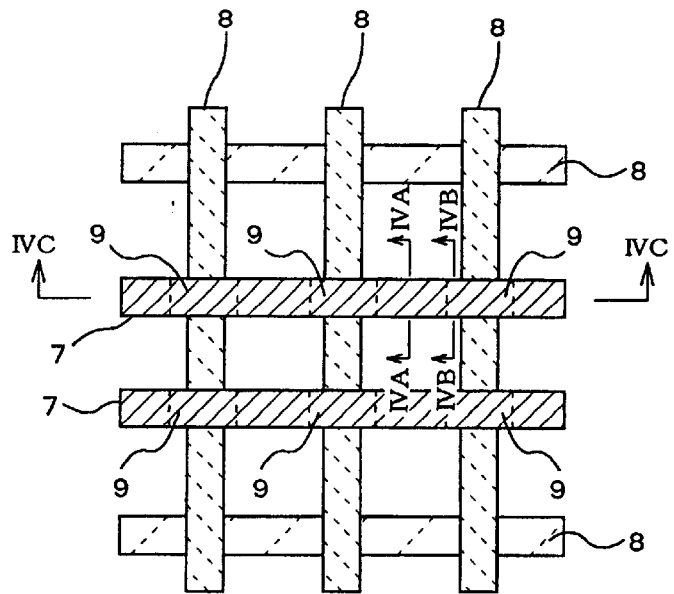

Using a mask of photo resist, as shown FIG. 5B, the width direction(arrow 90) parts of the floating gate electrode 5, silicon oxide film 9, ferroelectric layer 6, and the control gate electrode 7 are formed. FIG. 4C shows a cross section taken along the line IVC—IVC in FIG. 5B.

Figure 6A:
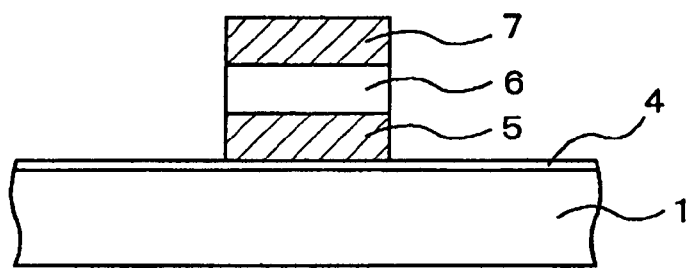
FIGS. 6A and 6B are cross-sectional views of essential parts in FIG. 5B.
Figure 6B:
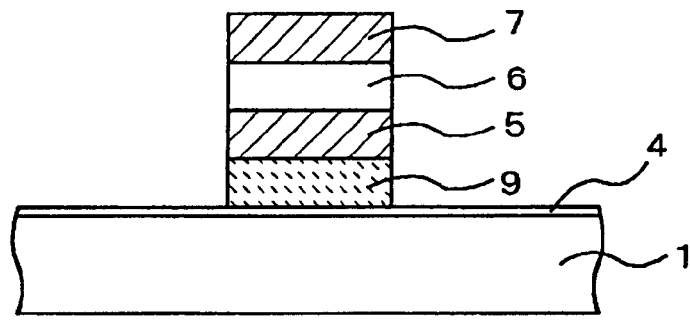

Section IVA—IVA in FIG. 5B is shown in FIG. 6A. Section IVB—IVB in FIG. 5B is shown in FIG. 6B. In this way, in the approximate central part of the active region, two layers of the ferroelectric layer 6 and the control gate electrode 7, are stacked on the floating gate electrode 5. In the end portion of the active region, three layers of the silicon oxide film 9, ferroelectric layer 6 and the control gate electrode 7, are stacked on the floating gate electrode 5.

Thereafter, the process may follow the steps for ordinary ferroelectric memory: N-type impurity is ion-implanted using the control gate electrode as a mask to form the drain region 2 and the source region 3 by self-alignment method. Interlayer insulation film is formed over the entire surface by the CVD process, and drain lines and source lines are formed.

While this embodiment is described for the case in which the capacitance reducing insulation film 9 is formed between the floating gate electrode 5 and the ferroelectric layer 6, it may be formed between the ferroelectric layer 6 and the control gate electrode 7. That is, it may be formed between the floating gate electrode 5 and the control gate electrode 7.

Also the capacitance reducing insulation film may be formed similarly in the MFIS structure having no floating gate electrode. In that case, the process of forming the floating gate shown in FIG. 3B may be omitted.

Next, an example of constituting a memory by arranging the ferroelectric memories of the above-described structure in a matrix pattern will be described in reference to FIGS. 7 and 8.

Figure 7:
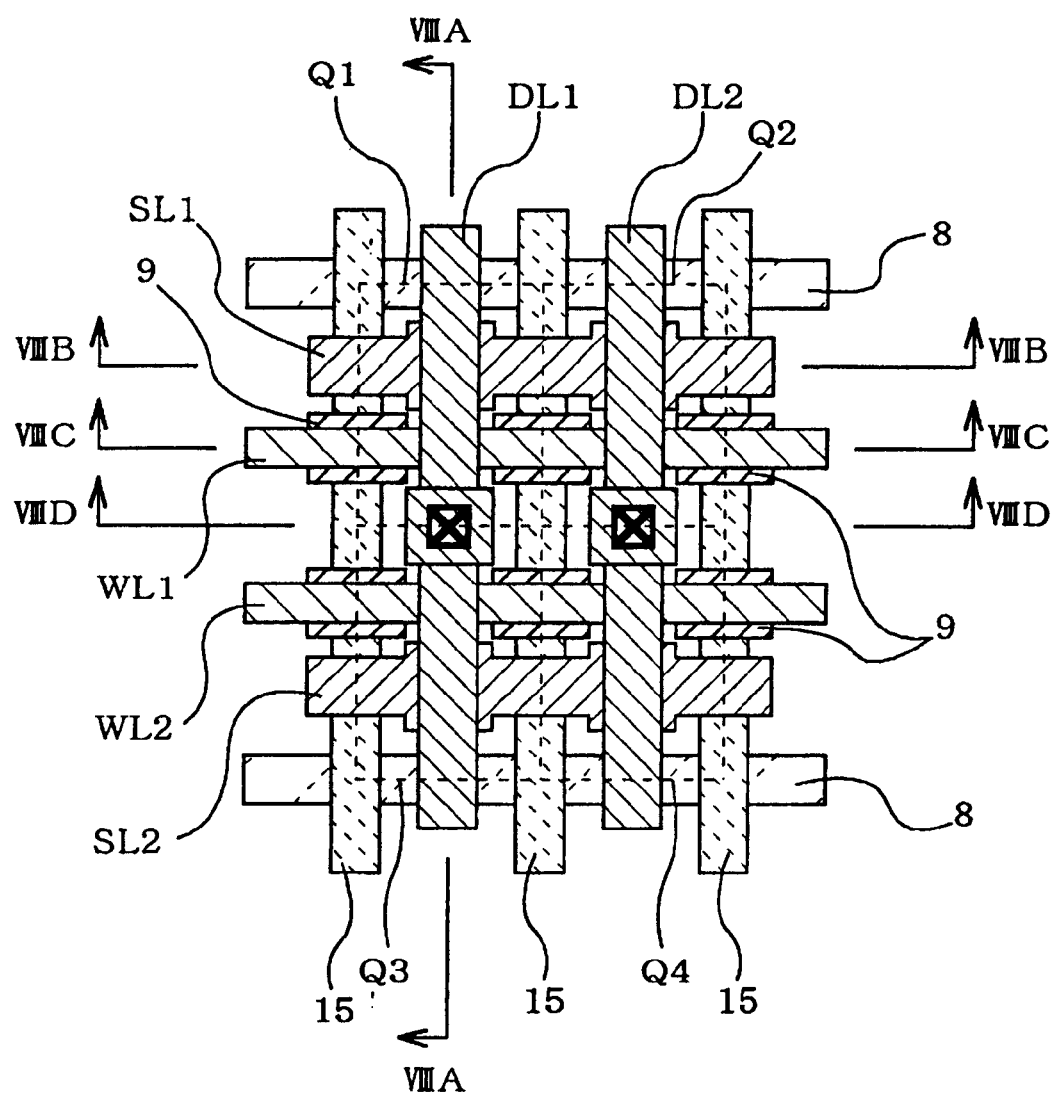
FIG. 7 is a structural drawing of a memory constituted by arranging the FET portion of FIG. 1 in a matrix pattern.

FIG. 7 is a plan view of one example of such configuration. FIGS. 8A, 8B, 8C, and 8D respectively show explanatory cross sections VIIIA—VIIIA, VIIIB—VIIIB, VIIIC—VIIIC, and VIIID—VIIID in FIG. 7.

FIG. 7 shows four ferroelectric memory FETs (memory cells Q1 through Q4) formed. Incidentally, in FIGS. 7 and 8, the gate oxide film and the floating gate electrode are left out of illustration.

Figure 8A:
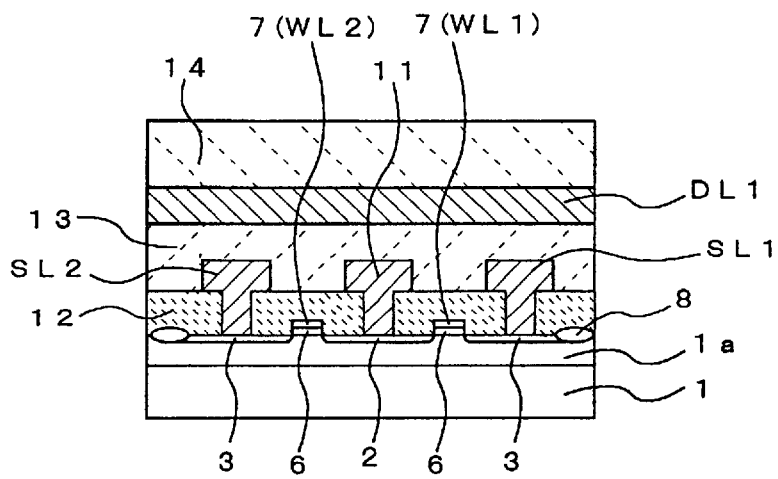
FIGS. 8A, 8B, 8C and 8D show cross sections in FIG. 7.
Figure 8B:
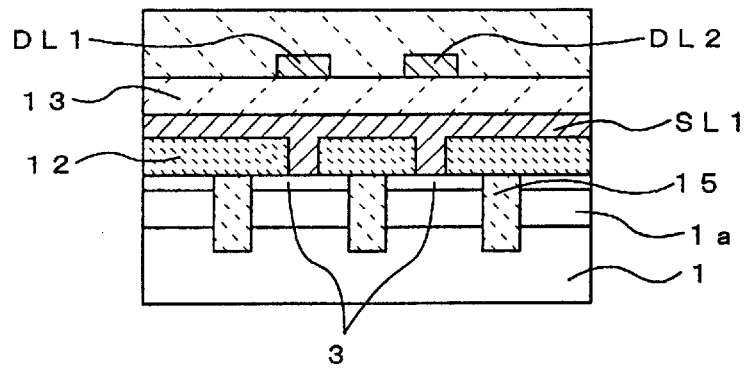
Figure 8C:
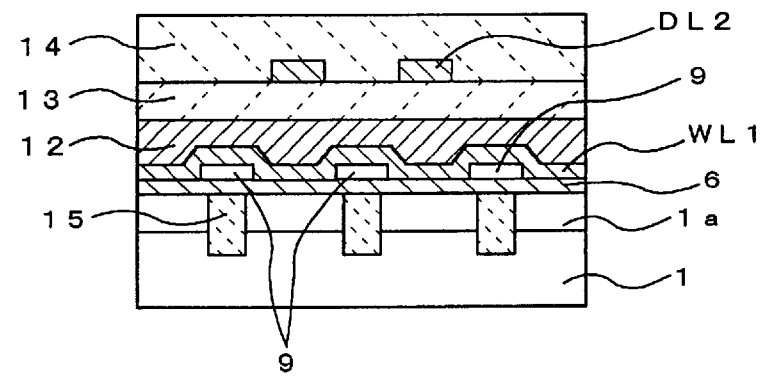
Figure 8D:
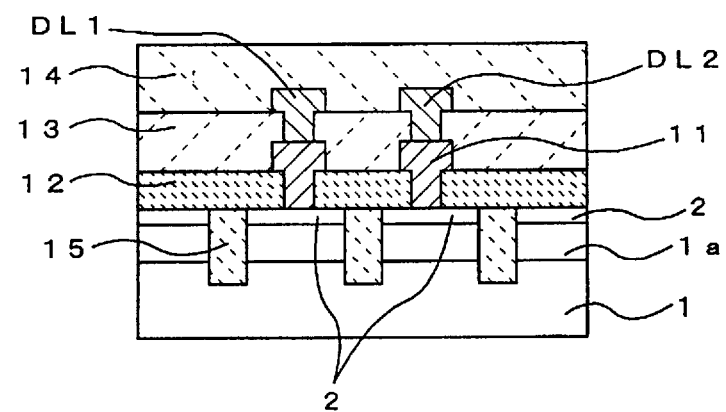
Figure 9:
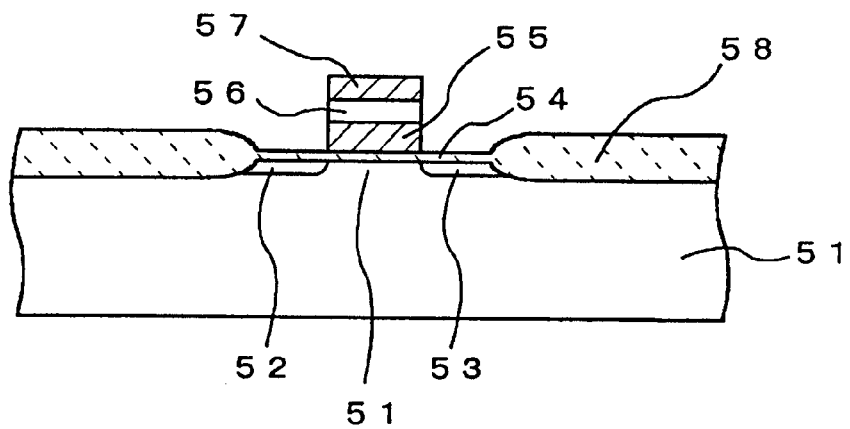
FIG. 9 shows a cross section of an essential part of a conventional ferroelectric FET.
Figure 10A:
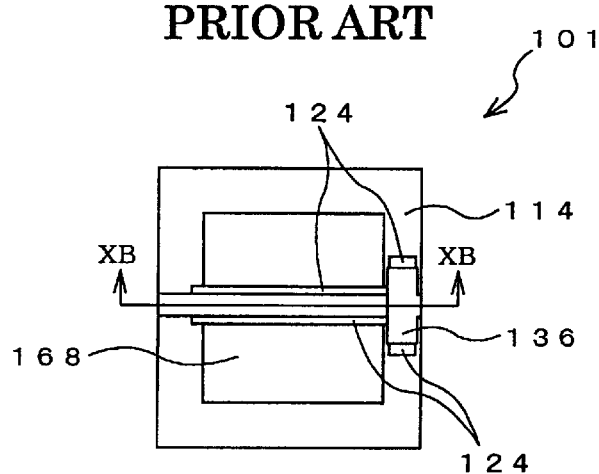
FIGS. 10A, 10B and 10C show conventional ferroelectric FETs.
Figure 10B:
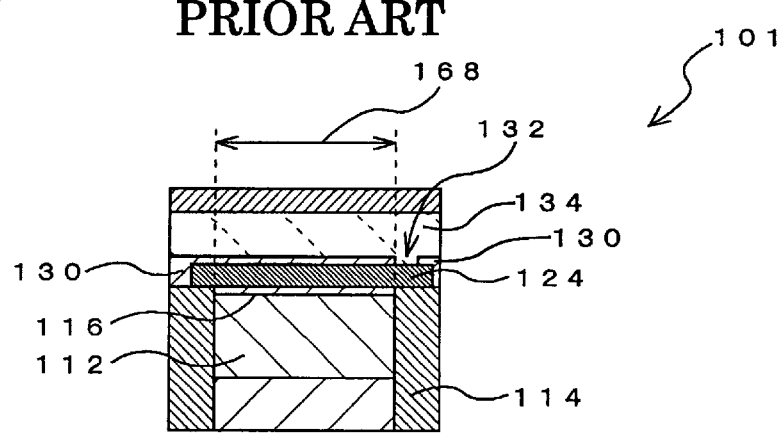
Figure 10C:
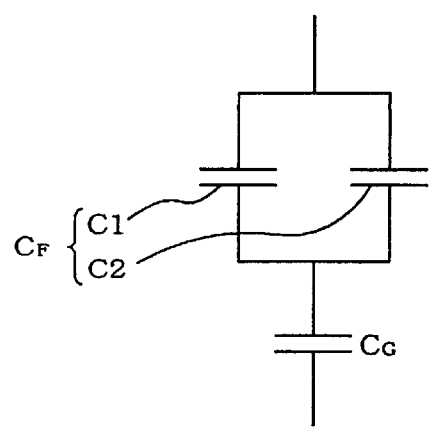

As shown in FIG. 8A, a p-typewell 1a is provided on a substrate 1. As shown in FIGS. 7, 8A and 8D, the well 1a is divided in the vertical row direction with LOCOS oxide films 8, and in the lateral direction with deep isolation trenches 15.

As shown in FIG. 8A, an n-type drain region 2 and a source region 3 are formed in the well 1a. On part of the well 1a between the drain region 2 and the source region 3, a gate oxide film (not shown) and a floating gate electrode (not shown) are formed.

The control gate electrode 7 is formed on the floating gate electrode through the ferroelectric layer 6.

As shown in FIG. 7, the control gate electrode 7 constitutes word lines WL1, WL2 formed in succession in the lateral row direction. As shown in FIG. 8C, an insulation film 9 as a second insulation film is provided between the ferroelectric layer 6 and the control gate electrode 7.

An interlayer insulation film 12 is formed on the control gate electrode 7. As shown in FIGS. 8A and 8B, source lines SL1 and SL2 connecting source regions 3 of respective cells arranged in lateral rows as seen in FIG. 7 are formed on the interlayer insulation film 12.

An interlayer insulation film 13 is formed on the source lines SL1 and SL2. As shown in FIGS. 8A through 8D, data lines DL1 and DL2 connecting drain regions 2 arranged in the vertical rows as seen in FIG. 7 through first metal layers 11 are provided on the interlayer insulation film 12.

Thus, a semiconductor memory can be constituted in which memory cells are provided in a matrix pattern.

The well 1a divided in the lateral row direction with the deep isolation trenches 15 serves as bit lines BL1 and BL2 (not shown) extending parallel to the drain lines. The well 1a may be provided with contacts spaced at equal intervals so as to lower its resistance.

The ferroelectric memory device of this invention is provided with the substantial capacitance reducing insulation film for reducing substantial capacitance of the ferroelectric layer, formed on only part of the substrate region between the pair of impurity regions and between the first insulation film and the upper electrode. Therefore, the partial voltage for the ferroelectric layer can be increased. This enables the memory device to be driven with a low writing voltage.

In the ferroelectric memory device of this invention, the substantial capacitance reducing insulation film is smaller in dielectric constant than the ferroelectric layer. Therefore, the partial voltage for the ferroelectric layer can be increased even with a smaller area of the firm.

In the ferroelectric memory device of this invention, the substantial capacitance reducing insulation film for reducing substantial capacitance of the ferroelectric layer is formed between the first insulation film and the upper electrode, and on the substrate region between the pair of impurity regions, and there are a portion where only the ferroelectric layer is present and a portion where the capacitance reducing insulation film and the ferroelectric layer are present in overlapped state. Therefore, the partial voltage for the ferroelectric layer can be increased. This enables the memory device to be driven with a low writing voltage.

In the semiconductor memory having the ferroelectric memory FET of this invention, a second insulation film is located at the upper or under side of the ferroelectric layer corresponding to part of the area of the ferroelectric layer. Therefore, the substantial capacitance of the ferroelectric layer can be reduced. This enables the memory device to be driven with a low writing voltage.

The manufacturing method of the ferroelectric memory device of this invention is characterized by comprising the step of forming a capacitance reducing insulation film between the first insulation film and the upper electrode to reduce substantial capacitance of the ferroelectric layer, on the substrate region and in the lower region of the upper electrode, to provide a portion in which only the ferroelectric layer is present and a portion in which the capacitance reducing insulation film and the ferroelectric layer are superimposed.

Therefore, it is possible to provide a ferroelectric memory device with which the partial voltage on the ferroelectric layer is increased.

The semiconductor memory using the ferroelectric layer of this invention is one having a ferroelectric memory FET in which a control gate electrode is provided on a semiconductor layer through at least a first insulation layer and a ferroelectric layer, with a second insulation film being inserted in a position that is on top or under side of the ferroelectric layer and corresponds to part of the area of the ferroelectric layer.

With the above-described constitution, the capacitance of part of the ferroelectric layer having the second insulation film is reduced, and the part may be seen as an insulation member in an electric circuit, and the same effect is provided as in the case in which the capacitance with the ferroelectric layer is reduced to that with the area where the second insulation film is not present. As the capacitance with the ferroelectric layer is reduced, partial voltage applied to the ferroelectric layer increases.

It is preferable that the second insulation film is made of a material having a smaller dielectric constant than that of the ferroelectric layer, because the effect of reduced substantial area of the ferroelectric layer increases due to reduced capacitance of that part.

Specifically, it is possible for example to constitute the ferroelectric memory FET in which; a floating gate electrode is disposed between the semiconductor layer and the control gate electrode, the ferroelectric layer is disposed between the floating gate electrode and the control gate electrode, and the second insulation layer is disposed between the floating gate electrode and the control gate electrode.

The ferroelectric memory of this invention has an insulation film to reduce the effective area of the ferroelectric layer. Therefore, a high partial voltage can be applied to the ferroelectric layer. As a result, the ferroelectric memory FET can be driven with a low drive voltage. That is, it is eliminated to; use a special ferroelectric material, make the gate oxide film too thin, or apply a special process to the ferroelectric layer.

While the invention is described above by way of preferred embodiments, the terms used herein are not for limitation but for explanation only, and may be changed or modified within the scope of the appended claims without departing from the scope and spirit of the invention.

What is claimed is:

1. A ferroelectric memory device comprising
   A)
   a1) a semiconductor substrate having a substrate region of a first conductive type;
   a2) a pair of impurity regions of a second conductive type formed on the surface of the first conductive region;
   a3) a first insulation film formed on the substrate region between the pair of impurity regions;
   a4) a ferroelectric layer formed on the first insulation film;
   a5) an upper electrode formed on the ferroelectric layer; and
   B) a substantial capacitance reducing insulation film formed between the first insulation film and the upper electrode and only on part of the substrate region between the pair of impurity regions to reduce substantial capacitance of the ferroelectric layer.

2. A ferroelectric memory device, comprising:
   A)
   a1) a semiconductor substrate having a substrate region of a first conductive type;
   a2) a pair of impurity regions of a second conductive type formed on the surface of the first conductive region;
   a3) a first insulation film formed on the substrate region between the pair of impurity regions;
   a4) a ferroelectric layer formed on the first insulation film;
   a5) an upper electrode formed on the ferroelectric layer; and
   B) a substantial capacitance reducing insulation film formed between the first insulation film and the upper electrode and only on part of the substrate region between the pair of impurity regions to reduce substantial capacitance of the ferroelectric layer,
      characterized in that the substantial capacitance reducing insulation film is smaller in dielectric constant than the ferroelectric layer.

3. A ferroelectric memory device of claim 2, characterized in that a conductive layer of a floating type is provided between the ferroelectric layer and the first insulation film, and the substantial capacitance reducing insulation film is located between the ferroelectric layer and the conductive layer of a floating type.

4. A ferroelectric memory device comprising:
   A)
   a1) a semiconductor substrate having a substrate region of a first conductive type;
   a2) a pair of impurity regions of a second conductive type formed on the surface of the first conductive region;
   a3) a first insulation film formed on the substrate region between the pair of impurity regions;
   a4) a ferroelectric layer formed on the first insulation film;
   a5) an upper electrode formed on the ferroelectric layer; and
   B) a substantial capacitance reducing insulation film formed between the first insulation film and the upper electrode to reduce substantial capacitance of the ferroelectric layer, and having, on the substrate region between the pair of impurity regions, a portion in which only the ferroelectric layer is present and a portion in which the capacitance reducing insulation film and the ferroelectric layer are present in superimposed state.

5. A ferroelectric memory device, comprising:
   A)
   a1) a semiconductor substrate having a substrate region of a first conductive type;
   a2) a pair of impurity regions of a second conductive type formed on the surface of the first conductive region;
   a3) a first insulation film formed on the substrate region between the pair of impurity regions;
   a4) a ferroelectric layer formed on the first insulation film;
   a5) an upper electrode formed on the ferroelectric layer; and
   B) a substantial capacitance reducing insulation film formed between the first insulation film and the upper electrode to reduce substantial capacitance of the ferroelectric layer, and having, on the substrate region between the pair of impurity regions, a portion in which only the ferroelectric layer is present and a portion in which the capacitance reducing insulation film and the ferroelectric layer are present in superimposed state,
      characterized in that the substantial capacitance reducing insulation film is smaller in dielectric constant than the ferroelectric layer.

6. A ferroelectric memory device of claim 5, characterized in that a conductive layer of a floating type is provided between the ferroelectric layer and the first insulation film, and the substantial capacitance reducing insulation film is located between the ferroelectric layer and the conductive layer of a floating type.

7. A semiconductor memory having a ferroelectric memory FET in which a control gate electrode is provided on a semiconductor layer through at least a first insulation film and a ferroelectric layer, characterized in that a second insulation film is superimposed on the ferroelectric layer in part of the upper or under side of the ferroelectric layer corresponding to part of the area of the ferroelectric layer.

8. A semiconductor memory having a ferroelectric memory FET in which a control gate electrode is provided on a semiconductor layer through at least a first insulation film and a ferroelectric layer, characterized in that a second insulation film is superimposed on the ferroelectric layer in pat of the upper or under side of the ferroelectric layer corresponding to part of the area of the ferroelectric layer and the second insulation film is smaller in dielectric constant than the ferroelectric layer.

9. A semiconductor memory of claim 8, characterized in that;

the ferroelectric memory FET has a floating gate electrode between the semiconductor layer and the control gate electrode, the ferroelectric layer is disposed between the floating gate electrode and the control gate electrode, and the second insulation film is disposed between the floating gate electrode and the control gate electrode.

10. A method of manufacturing a ferroelectric memory device, comprising the steps of:

a1) providing a semiconductor substrate having a substrate region of a first conductive type;

a2) forming a first insulation film in part of the substrate region;

a3) forming a ferroelectric layer and an upper electrode on the first insulation layer;

a4) forming an impurity region of a second conductive type in the substrate region by implanting the second conductive type of impurity using the upper electrode as a mask; and B) forming a capacitance reducing insulation film between the first insulation film and the upper electrode to reduce substantial capacitance of the ferroelectric layer, on the substrate region and in the lower region of the upper electrode, to provide a portion in which only the ferroelectric layer is present and a portion in which the capacitance reducing insulation film and the ferroelectric layer are superimposed.

11. A method of manufacturing a ferroelectric memory device of claim 10, characterized in that the substantial capacitance reducing insulation film is smaller in dielectric constant than the ferroelectric layer.

12. A method of manufacturing a ferroelectric memory device of claim 11, characterized in that a conductive layer of a floating type is provided between the ferroelectric layer and the first insulation film, and the substantial capacitance reducing insulation film is located between the ferroelectric layer and the conductive layer of a floating type.

* * * * *